United States Patent [19]

Van Aken

[11] Patent Number: 5,760,482
[45] Date of Patent: Jun. 2, 1998

[54] SEMICONDUCTOR DEVICE OF THE TYPE SEALED IN GLASS COMPRISING A SEMICONDUCTOR BODY CONNECTED TO SLUGS BY MEANS OF A SILVER-ALUMINUM BONDING LAYER

[75] Inventor: Timotheus J.M. Van Aken, Stadskanaal, Netherlands

[73] Assignee: U.S. Philips Corporation, New York, N.Y.

[21] Appl. No.: 839,430

[22] Filed: Apr. 14, 1997

Related U.S. Application Data

[63] Continuation of Ser. No. 615,926, Mar. 14, 1996, abandoned.

[30] Foreign Application Priority Data

Mar. 20, 1995 [EP] European Pat. Off. ............ 95200660

[51] Int. Cl.⁶ .................... H01L 29/00; H01L 23/48
[52] U.S. Cl. .................... 257/794; 257/771; 257/44; 257/787; 257/788; 257/104; 257/770; 257/763; 257/762; 257/764
[58] Field of Search .................... 257/771, 770, 257/763, 765, 764, 762, 44, 46, 51, 79, 81, 104, 787, 788, 794

[56] References Cited

U.S. PATENT DOCUMENTS

| | | | |
|---|---|---|---|
| 4,117,589 | 10/1978 | Francis et al. | 29/619 |
| 4,446,502 | 5/1984 | Boser et al. | 361/308 |
| 5,369,220 | 11/1994 | Harada et al. | 174/257 |

FOREIGN PATENT DOCUMENTS

| | | | |
|---|---|---|---|
| 84859 | 8/1983 | European Pat. Off. | 257/794 |
| 0690504A1 | 1/1996 | European Pat. Off. | H01L 23/532 |
| 54-3468 | 1/1979 | Japan | 257/794 |
| 57-91527 | 6/1982 | Japan | 257/794 |
| 58-176957 | 10/1983 | Japan | 257/794 |
| 59-191361 | 10/1984 | Japan | 257/787 |
| 59-224150 | 12/1984 | Japan | 257/794 |
| 60-187032 | 9/1985 | Japan | 257/794 |
| 60-218865 | 11/1985 | Japan | 257/794 |
| 1001291 | 6/1963 | United Kingdom . | |

OTHER PUBLICATIONS

"Constitution of Binary Alloys", by Dr. M. Hansen, 2nd Ed., McGraw–Hill Company, 1958, Ag–Al Alloys, pp. 1–3. No Month.

*Primary Examiner*—Tom Thomas
*Assistant Examiner*—Alexander Oscar Williams
*Attorney, Agent, or Firm*—Brian J. Wieghaus

[57] ABSTRACT

The invention relates to a semiconductor device of the type sealed in glass, comprising a silicon semiconductor body having a pn-junction between opposing faces which are connected to slugs of a transition metal by means of a bonding layer, the bonding layer comprising a quantity of aluminum in the range between 7 and 15 wt. % and a quantity of silver in the range between 85 and 93 wt. %.

8 Claims, 1 Drawing Sheet

5,760,482

SEMICONDUCTOR DEVICE OF THE TYPE SEALED IN GLASS COMPRISING A SEMICONDUCTOR BODY CONNECTED TO SLUGS BY MEANS OF A SILVER-ALUMINUM BONDING LAYER

This is a continuation of application Ser. No. 08/615,926, filed Mar. 14, 1996, now abandoned.

BACKGROUND OF THE INVENTION

The invention relates to a semiconductor device of the type sealed in glass, comprising a silicon semiconductor body having a pn-junction between opposing faces, which are connected to slugs of a transition metal by means of a silver- and aluminium-containing bonding layer, at least the semiconductor body and a part of the slugs being covered by the glass.

Such a device, which is also referred to as glass-bead diode, is particularly suitable for applications in which a very good passivation, a hermetic sealing of the semiconductor body, mechanical strength or resistance against high temperatures are important factors. The glass passivates the semiconductor body and forms a barrier against moisture. Apart from the semiconductor body, the glass also covers the part of the slugs adjacent to said semiconductor body. In such a device, the slugs of a transition metal, the glass and the semiconductor body have coefficients of thermal expansion which are of the same order of magnitude to preclude defects caused by thermal expansion. Such a device is made by soldering the semiconductor body to the slugs at a relatively high temperature by means of a so-called "brazing process", that is, a soldering process at a relatively high temperature (above approximately 450° C.). Subsequently, the glass is provided at a temperature which is lower than that of the soldering process.

A device of the type mentioned in the opening paragraph is known from the abstract in the English language of Japanese Patent Application No. 60-187032, in which the bonding layer comprises a quantity of aluminium in the range between 15 and 45 wt. % and a quantity of silver in the range between 85 and 55 wt. %.

In practice it has been found that such a bonding layer is not always satisfactory. For example, there is often insufficient adhesion and a poor electrical contact between the semiconductor body and the slugs.

SUMMARY OF THE INVENTION

It is an object of the invention, inter alia, to obviate said drawback.

To this end, the device in accordance with the invention is characterized in that the bonding layer comprises a quantity of aluminium in the range between 7 and 15 wt. % and a quantity of silver in the range between 85 and 93 wt. %.

By virtue thereof, a bonding layer is obtained which proves to be satisfactory in practice.

The invention is based on the recognition that the bonding layer is attacked when the semiconductor body is subjected to a preliminary cleaning treatment which is a prerequisite for the provision of the glass. The bonding layer is attacked by practically all cleaning agents, but in particular if a customarily used cleaning agent having a pH in excess of 7 is used during so-called lye etching. By virtue of the measure in accordance with the invention, the bonding layer comprises a silver-aluminium alloy which is in the so-called zeta-phase (reference is made, for example, to: "Constitution of Binary Alloys" by M. Hansen, second edition, McGraw-Hill Book Company, 1958, "Ag-Al Alloys", pp. 1–3). In practice it has been found that such a zeta-phase has a much higher resistance against attack by cleaning agents than the known alloy. Thus, if a bonding layer in accordance with the invention is used, said bonding layer is not attacked. Consequently, the adhesion and the electrical contact between the semiconductor body and the slugs is satisfactory.

The device in accordance with the invention is preferably characterized in that the bonding layer comprises a quantity of aluminium in the range between 10 and 15 wt. % and a quantity of silver in the range between 85 and 90 wt. %. This results in a greater mechanical strength of the bonding layer. It has further been found that if the aluminium content is below 10 wt. %, a higher percentage of rejects occurs in the manufacturing process, which can be attributed to the fact that silicon of the semiconductor body dissolves in the bonding layer and to the formation of chemical compounds such as suicides between the dissolved silicon and the metal of the slugs.

An additional advantage is obtained if the bonding layer comprises a quantity of aluminium in the range between 10 and 12 wt. % and a quantity of silver in the range between 88 and 90 wt. %. Such a quantity of aluminium leads to a relatively high melting point of approximately 727° C. of the bonding layer.

Preferably, a titanium-containing layer is provided between the semiconductor body and the bonding layer. Such a titanium-containing layer enables an even better adhesion of the bonding layer to the semiconductor body to be achieved.

These and other aspects of the invention will be apparent from and elucidated with reference to the embodiments described hereinafter.

The Figures are purely schematic and not drawn to scale.

DETAILED DESCRIPTION OF THE PREFERRED EMBODIMENTS

Figure 1:
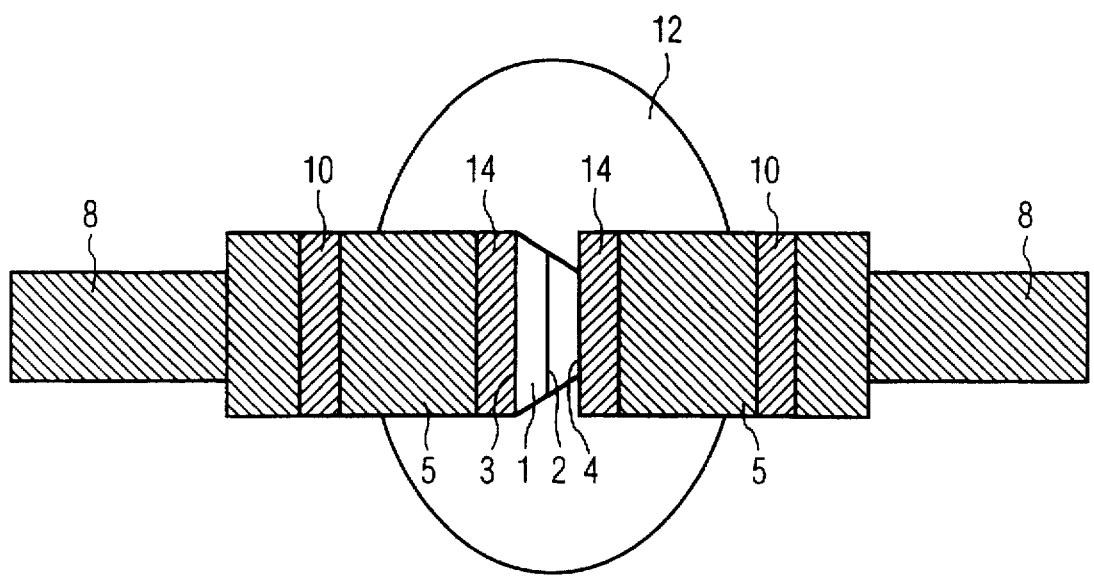
FIG. 1 shows a glass-bead diode.

FIG. 1 shows a glass-bead-diode semiconductor device of the type sealed in glass, comprising a silicon semiconductor body 1 having a pn-junction 2 between opposing faces 3, 4, which are connected to slugs 5 of a transition metal by means of a silver- and aluminium-containing bonding layer 14, at least the semiconductor body 1 and a part of the slugs 5 being covered with the glass 12. The slugs are composed of metals such as tungsten or molybdenum. Alternatively, use is made of combinations of metals, for example, from the group formed by iron, nickel and copper, which combinations are also known by names such as dumet, fernico or invar. In practice, use is preferably made of molybdenum slugs. In practice, said slugs 5 are usually connected to connection wires 8 by means of a bonding layer 10.

Such a device is made by applying a silver layer and an aluminium layer to the semiconductor body 1, for example, by means of vapor deposition or sputtering. Subsequently, parts of the glass-bead diode, such as the silicon semiconductor body 1, molybdenum slugs 5 and copper-containing connection wires 8 are positioned relative to each other as shown in the Figure. Plates manufactured from the material of the bonding layer 10, preferably an alloy of AgCu28Ge2Co0.2, in which the numbers represent percentages by weight, are provided at the location of the bonding layer 10. Subsequently, the parts are brought to a temperature in the range between 800° and 830° C. Next, the semiconductor body 1 is soldered to the slugs 5 by means of the bonding layer 14 and said slugs 5 are soldered to the connection wires 8 by means of the adhesive layer 10, so that a soldered structure is obtained. For the manufacture of glass-bead diodes, preferably, temperatures below approximately 830° C. and soldering times below 20 minutes are observed, because at higher temperatures and longer soldering times material of the bonding layer 10 diffuses away and the properties of the bonding layer undergo a change. After the soldering process, the soldered structure is cleaned by means of so-called lye etching in a solution having a pH>11, preferably a 1N lye such as 40 g/l NaOH to allow the glass 12 to adhere well to the structure. After said cleaning step, a glass suspension, for example, of lead-borate glass or zinc-borate glass, also referred to as Schott glass or Ferro glass, is provided on the structure thus formed. The glass suspension is sintered at a lower temperature, in this example a temperature ranging between 700° and 730° C., than the temperature used during soldering. The glass 12 covers the semiconductor body 1 and at least a part of the slugs 5 (see Figure).

In accordance with the invention, the bonding layer comprises a quantity of aluminium in the range between 7 and 15 wt. % and a quantity of silver in the range between 85 and 93 wt. %. By virtue thereof, a bonding layer is obtained which proves to be very satisfactory in practice. In practice it has been found that a bonding layer 14 in accordance with the invention exhibits a very high resistance to attack by cleaning agents. Said bonding layer 14 preferably comprises a quantity of aluminium in the range between 10 and 15 wt. % and a quantity of silver in the range between 85 and 90 wt. %. By virtue thereof, the strength of the bonding layer 14 is increased. It has further been found that if the aluminium content is below 10 wt. %, a higher percentage of rejects occurs in the manufacturing process, which can be attributed to the fact that silicon of the semiconductor body dissolves in the bonding layer and to the formation of chemical compounds such as silicides between the dissolved silicon and the metal of the slugs. An additional advantage is obtained if the bonding layer 14 comprises a quantity of aluminium in the range between 10 and 12 wt. % and a quantity of silver in the range between 88 and 90 wt. %. If the bonding layer 14 comprises such a quantity of aluminium, it has a relatively high melting point of approximately 727° C., so that during application of glass 12 to passivate the semiconductor body 1, problems caused by remelting of the bonding layer 14 do not occur.

Figure 2:
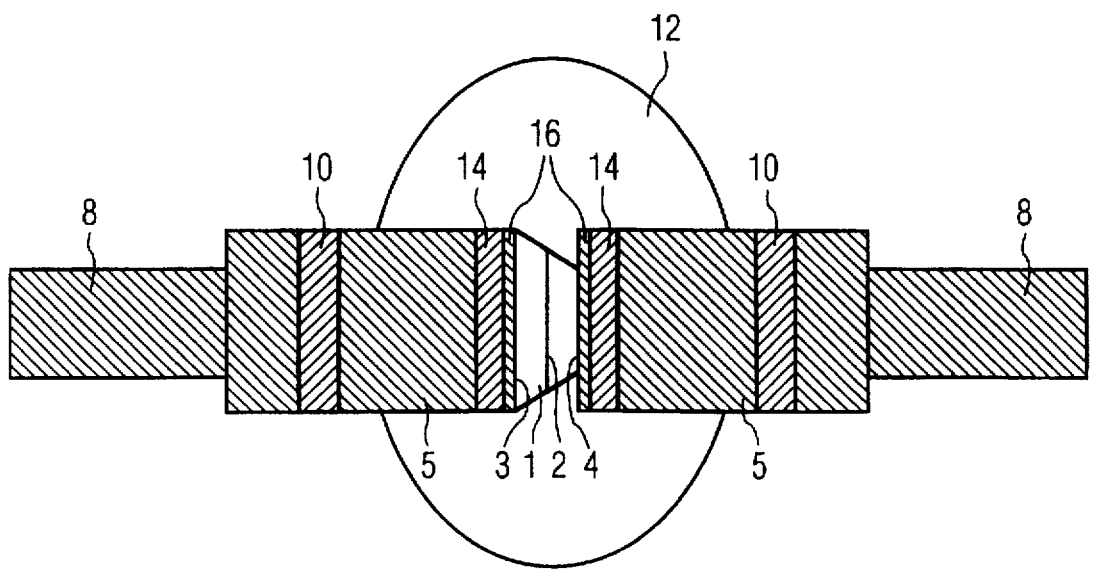
FIG. 2 shows a glass-bead diode.

Bonding layers having different silver: aluminium compositions are obtained, for example, by providing a silver layer and an aluminium layer in a specific thickness on the semiconductor body 1 by means of known vapor deposition or sputter techniques. For example, for a bonding layer comprising a quantity of aluminium of approximately 11% and a quantity of silver of approximately 89%, a silver layer of 3.65 μm and an aluminium layer of 3 μm are applied. To remove damaged parts from the aluminium layer, 0.6 μm aluminium is etched away in a so-called pre-etching process. After a soldering treatment at approximately 820° C., the desired bonding layer 14 is obtained. By diffusion into the slug 5, a bonding layer is obtained whose composition differs slightly from the composition applied by vapor deposition. Preferably, as shown in FIG. 2, a titanium-comprising layer 16 is applied between the semiconductor body and the bonding layer. Such a titanium-comprising layer allows a very good adhesion of the bonding layer to the semiconductor body to be achieved. Such a layer is applied to the semiconductor body, for example by vapor deposition, before the silver and aluminium layers are applied. Such a titanium-comprising layer has a thickness, for example, of approximately 0.2 micron.

The invention is not limited to the above-described exemplary embodiments. For example, in the exemplary embodiments the semiconductor body 1 is a diode provided with one pn-junction 2 between opposing faces 3, 4. It is alternatively possible, however, that the semiconductor body 1 comprises a number of series-arranged pn-junctions 2. The semiconductor device can then suitably be used to rectify relatively high voltages. In the foregoing, specific techniques for the manufacture of the bonding layer 14 are mentioned. However, this is not to be understood to mean that the device in accordance with the invention can only be manufactured by means of such techniques. For example, instead of vapor deposition or sputtering use can be made of application techniques such as electrodeposition or "chemical vapor deposition" (CVD), or the bonding layer can be provided by means of a paste. Further, an alloy of silver-:aluminium can be provided instead of a separate aluminium layer and a separate silver layer. The glass 12 can also be provided in a manner which differs from the one described hereinabove, for example by providing a glass tube around the semiconductor body and the slugs and melting said tube. In the example, connection wires are secured to the slugs S. It is alternatively possible, however, to use the slugs directly as an electrical connection, for example, after the slugs have been provided with a suitable solder layer. The semiconductor device can then be used as a so-called "surface mounting" device (SMD). It is further also possible to solder the slugs first to copper-containing connection conductors and then to the semiconductor body.

What is claimed is:

1. A semiconductor device, comprising a semiconductor body having a pn-junction between opposing faces, at least one of the faces being connected to a slug of a transition metal by a bonding layer, the bonding layer comprising a quantity of aluminum in the range between 7 and 15 wt. % and a quantity of silver in the range between 85 and 93 wt. %, wherein said quantities of silver and aluminum establish a zeta phase composition.

2. The semiconductor device as claimed in claim 1, wherein the bonding layer comprises a quantity of aluminum in the range between 10 and 15 wt. % and a quantity of silver in the range between 85 and 90 wt. %.

3. The semiconductor device as claimed in claim 1, wherein the bonding layer comprises a quantity of aluminum in the range between 10 and 12 wt. % and a quantity of silver in the range between 88 and 90 wt. %.

4. The semiconductor device as claimed in claim 1, wherein a titanium-containing layer is provided between the semiconductor body and the bonding layer.

5. The semiconductor device of claim 1, wherein the bonding layer comprises an alloy of silver and aluminum.

6. The semiconductor device of claim 1, wherein the bonding layer is formed by applying a layer of silver having a thickness of approximately 3.65 μm, applying a layer of aluminum having a thickness of approximately 3 μm, etching away approximately 0.6 μm of the aluminum layer and, after the operation of applying layers and etching, effecting a soldering treatment at approximately 820° C. for a selected duration.

7. The semiconductor device of claim 4, wherein the titanium-containing layer has thickness of approximately 0.2 micron.

8. A semiconductor device, comprising a semiconductor body having a pn-junction between opposing faces, at least one of the faces being connected to a slug of a transition metal by a bonding layer, the bonding layer comprising a quantity of aluminum and a quantity of silver, said quantities being in relative proportion so as to establish a zeta-phase composition of aluminum and silver.

* * * * *